United States Patent [19]

Naruke

[11] Patent Number: 4,675,981
[45] Date of Patent: Jun. 30, 1987

[54] METHOD OF MAKING IMPLANTED DEVICE REGIONS IN A SEMICONDUCTOR USING A MASTER MASK MEMBER

[75] Inventor: Kiyomi Naruke, Kawasaki, Japan

[73] Assignee: Kabushiki Kaisha Toshiba, Kawasaki, Japan

[21] Appl. No.: 802,163

[22] Filed: Nov. 25, 1985

[30] Foreign Application Priority Data

Nov. 26, 1984 [JP] Japan ................... 59-249170

[51] Int. Cl.$^4$ ........................... H01L 21/265
[52] U.S. Cl. .................... 29/576 B; 29/571; 29/579; 148/1.5; 148/187; 148/DIG. 82; 148/DIG. 104
[58] Field of Search .............. 29/571, 576 B, 579; 148/1.5, 187

[56] References Cited

U.S. PATENT DOCUMENTS

| 4,158,141 | 6/1979 | Seliger | 148/1.5 |
| 4,201,800 | 5/1980 | Alcorn et al. | 148/187 |
| 4,231,811 | 11/1980 | Somekh | 148/1.5 |
| 4,244,752 | 1/1981 | Henderson, Sr. et al. | 148/1.5 |
| 4,253,888 | 3/1981 | Kikuchi | 148/187 |
| 4,311,533 | 1/1982 | Roche | 148/1.5 |
| 4,341,571 | 7/1982 | Hiss et al. | 148/1.5 |
| 4,376,658 | 3/1983 | Sigusch | 148/1.5 |
| 4,394,182 | 7/1983 | Maddox, III | 148/1.5 |
| 4,398,964 | 8/1983 | Malwah | 148/1.5 |
| 4,509,991 | 4/1985 | Taur | 148/1.5 |
| 4,546,534 | 10/1985 | Nicholas | 29/576 B |
| 4,578,859 | 4/1986 | Hause et al. | 29/576 B |

OTHER PUBLICATIONS

Tsang, et al., "Fabrication of High-Performance LDDFET's with Oxide Sidewall-Spacer Technology", IEEE Journal of Solid-State Circuits, vol. SC-17, No. 2, pp. 220-224, 1982.

Primary Examiner—Upendra Roy
Attorney, Agent, or Firm—Finnegan, Henderson, Farabow, Garrett & Dunner

[57] ABSTRACT

A method of manufacturing an MOS transistor comprises the steps of forming a silicon nitride film on a central portion of a P-type silicon substrate, forming a first resist pattern on the semiconductor substrate and the film using a mask member having a central opening, ion-implanting a first impurity of P-type into the substrate using the first resist pattern and the film as masks, removing the first resist pattern from the semiconductor substrate, forming a second resist pattern on the substrate using the mask member, and ion-implanting a second impurity of P-type into the substrate at a low acceleration voltage using the second resist pattern as a mask. Then, a gate electrode is formed on the substrate and an impurity of n-type is implanted into the substrate to form source and drain regions of n-type.

7 Claims, 15 Drawing Figures

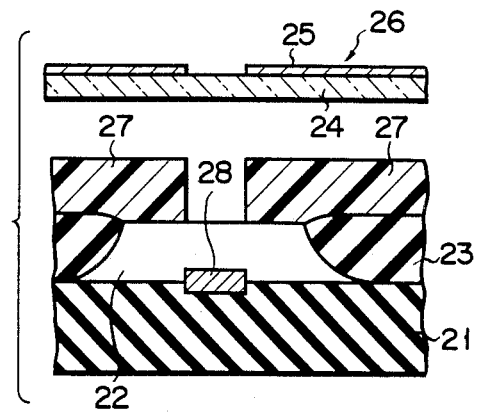
F I G. 4A
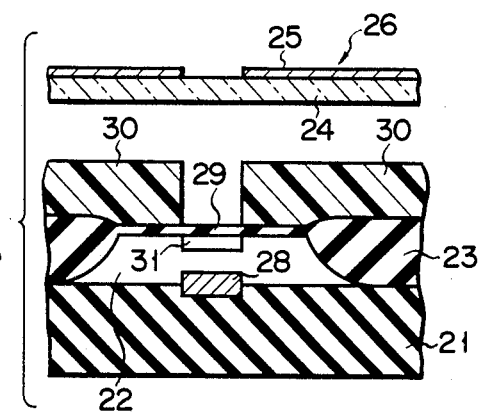
F I G. 4B
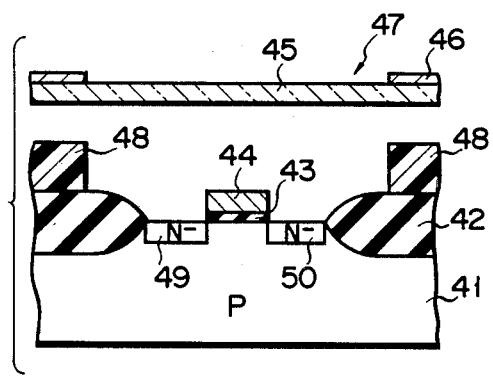
F I G. 5A
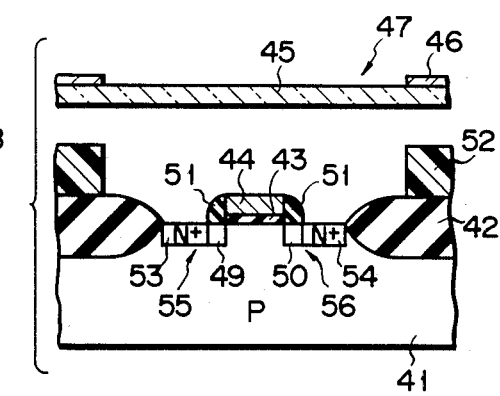
F I G. 5B

METHOD OF MAKING IMPLANTED DEVICE REGIONS IN A SEMICONDUCTOR USING A MASTER MASK MEMBER

BACKGROUND OF THE INVENTION

The present invention relates to a method of manufacturing a semiconductor device havng an ion-implanted layer.

A conventional n-channel MOS transistor is manufactured in a manner as shown in FIGS. 1A to 3.

Silicon nitride film 3 is formed on p-type silicon substrate 1 through silicon oxide buffer film 2. First resist pattern 7 is formed on oxide film 2, using first mask 6 obtained by forming chromium film 5 at a predetermined portion of the surface of glass plate 4 and having a central opening. Then, using resist pattern 7 and silicon nitride film 3 as a mask, boron, e.g., is ion-implanted into substrate 1, thereby forming ion-implanted layer 8 (shown in FIGS. 1A and 1B). After pattern 7 is removed, annealing is performed, using film 3 as a mask, forming field oxide film 9. Boron in layer 8 is activated, forming first impurity layer 10 of P+-type (which has higher impurity concentration than that of the P-type substrate). Film 3 and underlying film 2 are then removed, and second resist pattern 12 is formed, using second mask 11 (a frame-like mask having a central opening). Boron ions are then reimplanted into substrate 1, using resist pattern 12 as a mask, thus forming p+-type second impurity layer 13 (shown in FIGS. 2A and 2B). Note that leakage current between source and drain regions decreases due to layer 13. After pattern 12 is removed, gate oxide film 14 and polycrystalline silicon gate electrode 15 are sequentially formed on a substrate region (SDG portion) surrounded by film 9. Phosphorus ions are implanted into substrate 1, using electrode 15 as a mask, forming n+-type source and drain regions 16 and 17. As a result, an n-channel MOS transistor (shown in FIG. 3).

According to the conventional technique, however, pattern 7 for forming layer 8, and pattern 12 for forming layer 13 are formed separately. Hence, different types of mask must be used for first and second masks 6 and 11. These decreases the efficiency of manufacture and increases the manufacturing costs.

SUMMARY OF THE INVENTION

It is an object of the present invention to provide a method of manufacturing a semiconductor device, wherein a plurality of resist patterns for ion implantation can be formed using a single mask, improving operability and decreasing manufacturing costs.

BRIEF DESCRIPTION OF THE DRAWINGS

FIGS. 4A and 4B are sectional views showing steps of a method of manufacturing an n-channel MOS transistor according to a first embodiment of the present invention;

FIGS. 5A and 5B are sectional views showing steps of a method of manufacturing an n-channel MOS transistor according to a second embodiment of the present invention;

DETAILED DESCRIPTION OF THE PREFERRED EMBODIMENTS

Figure 1A:
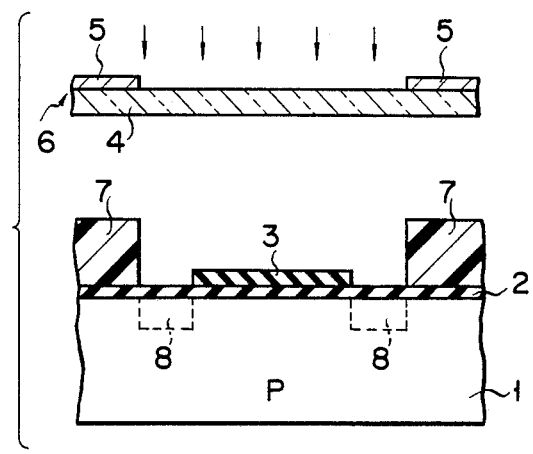
FIGS. 1A to 3 show steps of a conventional method of manuracturing an n-channel MOS transistor.
Figure 1B:
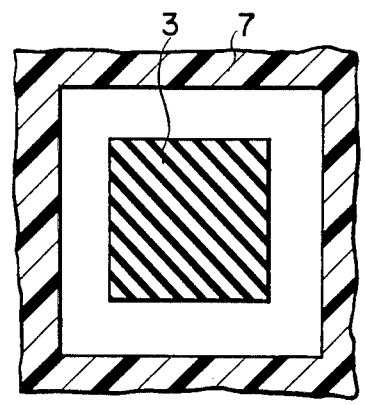
Figure 2A:
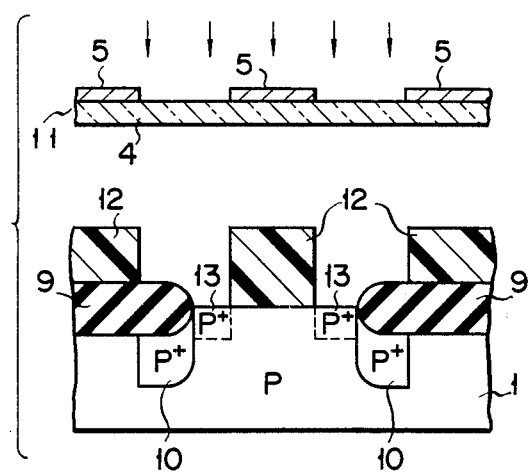
Figure 2B:
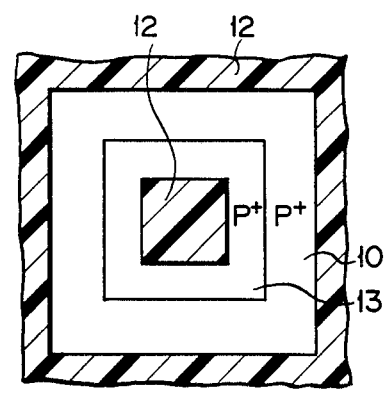
Figure 3:
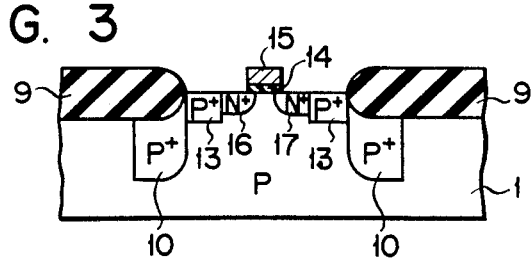

Embodiments of the present invention will be described with reference to the accompanying drawings.

First Embodiment

P-type silicon layer 22 was formed on sapphire plate 21, and field oxide film 23 was then formed by thermal oxidation on a surface of layer 22. Note that plate 21 and layer 22 constitute a semiconductor substrate. First resist pattern 27 was then formed on layer 22 and film 23 (with an opening corresponding to a central portion of layer 22) using mask member 26, obtained by forming chromium film 25 at a predetermined portion of the surface of glass plate 24 and having a central opening. Using resist pattern 27 as a mask, boron was ion-implanted at high acceleration speed such that the ion implantation speed was highest at the interface between layer 22 and sapphire plate 21, thereby forming p+-type first ion implantation layer 28 for decreasing back channel leakage current in the element (FIG. 4A). Resist pattern 27 was removed, and gate oxide film 29 was then formed on the portion of layer 22 surrounded by film 23. Second resist pattern 30 was formed on layer 22 and film 23 by once again masking member 26. Then, using pattern 30 as a mask, boron was ion-implanted at a low accerelation speed into layer 22, thereby forming p+-type second ion implantation layer 31 for threshold voltage control in the surface of layer 22 (FIG. 4B). After resist pattern 30 was removed, source and drain regions and a gate electrode (not shown) were formed by a known method on layer 22, thereby preparing an n-channel MOS transistor.

According to the first embodiment, first resist pattern 27 for forming first ion implantation layer 28 and second resist pattern 30 for forming second ion implantation layer 31 are both formed using single mask member 26. As a result, one process for manufacturing a mask member can be eliminated from the conventional method, thereby improving operability and decreasing manufacturing costs.

Second Embodiment

Field oxide film 42 was formed on a surface of p-type silicon substrate 41 as a semiconductor substrate, and thereafter gate oxide film 43 and polycrystalline silicon gate electrode 44 thereon were formed on an element region surrounded by film 42. First resist pattern 48 was then formed on film 42 (with an opening corresponding to an element region and part of film 42) using mask member 47, obtained by forming chromium film 46 at a predetermined portion of the surface of glass plate 45 and having a central opening. Using pattern 48 and electrode 44 as a mask, phosphorus was ion-implanted at an acceleration voltage of 35 KeV and a dose of $2 \times 10^{13}$ cm$^{-2}$ into the element region, thereby forming n−-type impurity regions 49 and 50 (FIG. 5A). After pattern 48 was removed, SiO$_2$ film 51 was deposited using CVD and etched by reactive ion etching (RIE), leaving the part of SiO$_2$ film 51 on substrate 41. Film 51 surrounds electrode 44. Then, second resist pattern 52 was formed on film 42 by using mask member 47 once again. Using pattern 52 as a mask, arsenic was then ion-implanted at an acceleration voltage of 40 KeV and a dose of $5 \times 10^{15}$ cm$^{-2}$, thereby forming n+-type impurity regions 53 and 54 in the regions 49 and 50. As a result, source region 55 was formed by regions 49 and 53, and drain region 56 was formed by regions 50 and 54, thereby preparing an n-channel MOS transistor with source and drain regions having low impurity concentrations in the vicinity of the gate electrode (FIG. 5B).

According to the second embodiment, first resist pattern 48 for forming n⁻-type impurity regions 49 and 50 and second resist pattern 52 for forming n⁺-type impurity regions 53 and 54 are both using single mask member 47. As a result, operability is improved and manufacturing costs decreased as in the first embodiment.

Third Embodiment

Figure 6A:
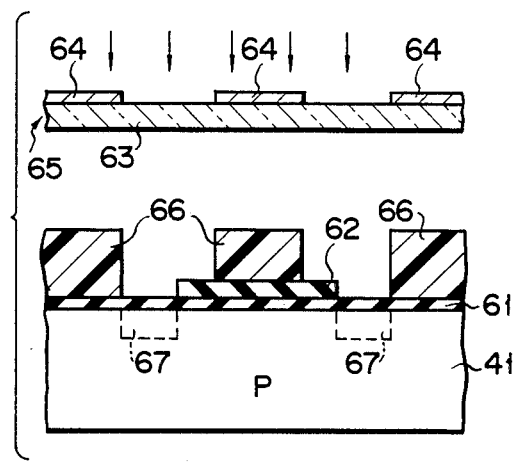
FIGS. 6A to 8 are views showing steps of a method of manufacturing an n-channel MOS transistor according to a third embodiment of the present invention.
Figure 6B:
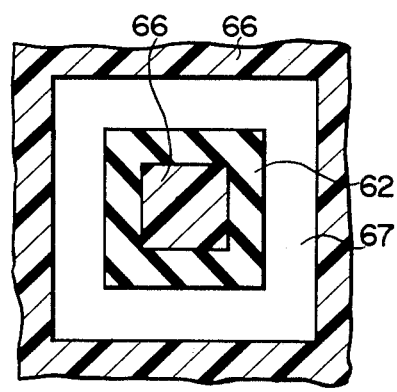
Figure 7A:
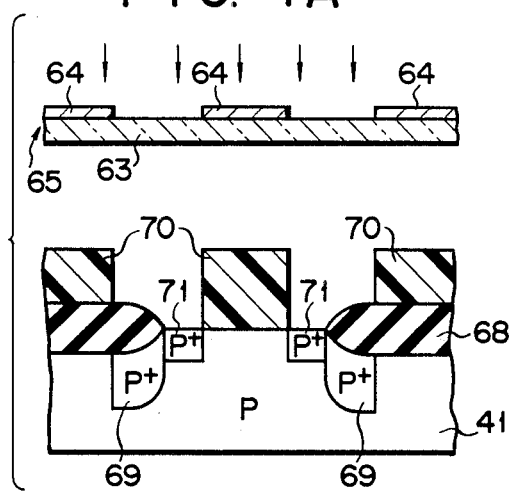
Figure 7B:
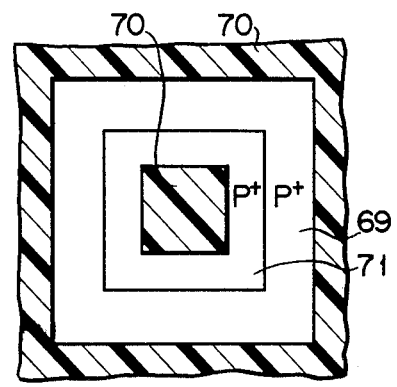
Figure 8:
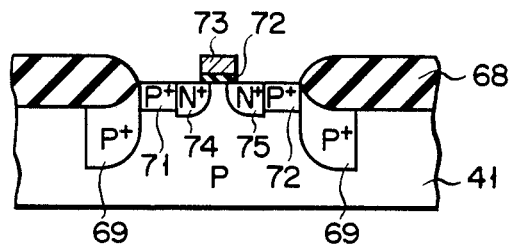
Figure 9:
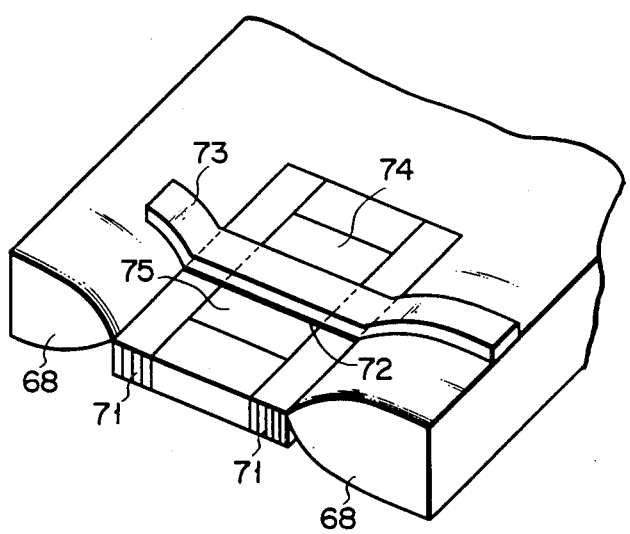
FIG. 9 is a perspective view of FIG. 7.

Silicon oxide buffer film 61 was formed on p-type silicon substrate 41 and silicon nitride film 62 was formed on the former. First resist pattern 66 was then formed on film 61 and a central portion of film 62 using frame-shaped mask member 65, obtained by forming chromium film 64 on a predetermined portion of the surface of glass plate 63 and having a central opening. Using pattern 66 and film 62 as masks, boron was ion-implanted into substrate 41, thereby forming ion implantation layer 67 (FIGS. 6A and 6B). Pattern 66 was removed, field oxide film 68 was formed using film 62 as a mask, and the substrate was heated so that boron in layer 67 was activated to form first p⁺-type impurity region 69. Film 62 and underlying film 61 were then removed, and second resist pattern 70 was selectively formed on substrate 41 and film 68 by using mask member 65 once again. Boron was again implanted into substrate 41 using pattern 70 as a mask, thereby forming second p⁺-type impurity region 71 (FIGS. 7A and 7B). Note that leakage current between the source and drain regions to be described later is decreased because of region 71. After pattern 70 was removed, silicon oxide film 72 and polycrystalline silicon gate electrode 73 thereon was formed on a substrate region (SDG) surrounded by film 68. Phosphorus was ion-implanted into substrate 41 using electrode 73 as a mask, so that n⁺-type source region 74 and drain region 75 were formed, thereby preparing an n-channel MOS transistor (FIGS. 8 and 9).

According to the third embodiment, first resist pattern 66 for forming ion implantation layer 67 and second resist pattern 70 for forming second p⁺-type impurity region 71 can both be formed using single mask member 65. As a result, operability may be improved and costs may be reduced as in the first embodiment.

As described above, the present invention provides a method of manufacturing a semiconductor device, wherein a plurality of resist patterns for ion implantation can be formed using a single mask member, thereby improving the efficiency of manufacture and reducing the manufacturing costs. One process for forming a mask member can be eliminated, thus reducing costs, and mask storage space in a mask alignment unit can be saved, hence improving operability. In addition, if a plurality of lots of semiconductor substrates are manufactured at the same time on a single line, resist patterns for forming layers 28 and 31 can be manufactured using a single mask setting, thereby improving operability.

What is claimed is:

1. A method of manufacturing a semiconductor device utilizing a single master mask comprising steps of:
    forming a first film (61), on a semiconductor substrate (41) having a first conductivity type;
    forming a second film (62) on a central portion of the first film (61);
    using a master mask (65) to form a first resist pattern (66), having a central portion located on the central portion of the second film (62) and overlying the area reserved for a gate region, and a peripheral portion located on said first film (61) and spaced from said second film (62), leaving exposed the area of the first film (61) located therebetween;
    masking the substrate with said first resist pattern and said second film for ion-implanting impurities into the substrate in a region adjacent to the periphery of said second film, to form a first ion-implantation layer having a first conductivity type;
    moving said first resist pattern (66);
    using said second film to mask said central portion of said first film to form a field insulating film about the periphery of said second film to cover said first ion-implantation layer;
    removing said second film and said first film (61) underlying said second film (62),
    using said master mask to form a second resist pattern (70), identical to said first resist pattern, said second resist pattern having a peripheral portion located on said field insulating film (68) and a central portion, overlying the area reserved for the gate region, located on the substrate (41) and spaced from the inner edge of the field insulating film (68);
    masking the substrate with said second resist pattern and said field insulating film for ion-implanting impurities in a region adjacent said first ion-implantation layer having said first conductivity type;
    removing said second resist pattern (70);
    forming a third film (72) and a gate electrode (73) overlying and in contact with said third film on a region of substrate (41) surrounded by said field insulating film (68); and
    using said gate electrode to mask an area central of said second ion-implantation layer for ion-implanting impurities into substrate (41), to form a third ion-implantation layer comprised of source region (74) and a drain region (75) having a second conductivity type.

2. A method according to claim 1, wherein said semiconductor substrate (41) includes a silicon substrate.

3. A method according to claim 2, wherein said first film (61) includes a silicon-oxide film and said second film (62) includes a silicon nitride film.

4. A method according to claim 3, wherein said second ion-implantation layer (71) has a shallower depth than said first ion-implantation layer (67, 69).

5. A method according to claim 4, wherein said second ion-implantation layer (71) has a rectangular ring shape and said source drain regions (73, 74) are adjacent to said second ion-implantation layer (71).

6. A method of manufacturing a semiconductor device utilizing a single master mask, comprising the steps of:
    forming a first film (42) on a surface of a semiconductor substrate (41) having a first conductivity type;
    forming a second film (43) and a gate electrode (44) overlying and in contact with said second film on a central portion of said first film;
    masking said substrate with said master mask to form a first resist pattern (48) on said first film (42), said pattern having a peripheral portion surrounding said central portion of said first film;

using said first resist pattern (48) and said gate electrode (44) and said second film (43) as a mask for ion-implanting impurities in the element region surrounding said gate electrode (44) and said second film (43) to form a first ion-implantation layer (49 and 50) having said first conductivity type;

removing said first resist pattern (48);

forming a third film (51) on substrate (41) immediately adjacent to the periphery of said gate electrode (44);

masking said substrate with said master mask (47) to form a second resist pattern (52), identical to said first resist pattern, on first film: (42);

using said second resist pattern as a mask for ion-implanting impurities in the element region surrounding said third film (51) to form source and drain regions (53 and 54), having a second conductivity type, adjacent said first ion-implantation layer.

7. The method of claim 6, wherein said semiconductor substrate (41) includes a silicon substrate.

* * * * *

UNITED STATES PATENT AND TRADEMARK OFFICE
CERTIFICATE OF CORRECTION

PATENT NO. : 4,675,981

DATED : June 30, 1987

INVENTOR(S) Kiyomi Naruki

It is certified that error appears in the above-identified patent and that said Letters Patent is hereby corrected as shown below:

In Claim 1, Column 4, Line 15;

"moving" should be --removing--

Signed and Sealed this

Third Day of May, 1988

Attest:

DONALD J. QUIGG

Attesting Officer

Commissioner of Patents and Trademarks